United States Patent
Moon et al.

(10) Patent No.: US 10,147,832 B2
(45) Date of Patent: Dec. 4, 2018

(54) APPARATUS FOR GENERATING TERAHERTZ WAVE AND METHOD FOR CONTROLLING TERAHERTZ WAVEFRONT USING THE SAME

(71) Applicant: Electronics & Telecommunications Research Institute, Daejeon (KR)

(72) Inventors: Ki Won Moon, Daejeon (KR); Kyung Hyun Park, Daejeon (KR); Il Min Lee, Daejeon (KR); Sang-Pil Han, Daejeon (KR); Eui Su Lee, Daejeon (KR)

(73) Assignee: ELECTRONICS & TELECOMMUNICATIONS RESEARCH INSTITUTE, Daejeon (KR)

( * ) Notice: Subject to any disclaimer, the term of this patent is extended or adjusted under 35 U.S.C. 154(b) by 44 days.

(21) Appl. No.: 15/447,662

(22) Filed: Mar. 2, 2017

(65) Prior Publication Data

US 2017/0256665 A1  Sep. 7, 2017

(30) Foreign Application Priority Data

Mar. 3, 2016  (KR) ........................ 10-2016-0025830

(51) Int. Cl.
*H01L 31/08* (2006.01)
*H01Q 3/26* (2006.01)
*H01L 31/0224* (2006.01)

(52) U.S. Cl.
CPC .......... *H01L 31/08* (2013.01); *H01L 31/0224* (2013.01); *H01Q 3/2676* (2013.01)

(58) Field of Classification Search
CPC ... H01L 31/08; H01L 31/0224; H01Q 3/2676; G21K 5/00; G21K 5/04
(Continued)

(56) References Cited

U.S. PATENT DOCUMENTS

| 8,853,633 | B2 | 10/2014 | Han et al. | |
| 2011/0080329 | A1* | 4/2011 | Nagel | ..................... H01Q 9/005 343/770 |

(Continued)

FOREIGN PATENT DOCUMENTS

KR  10-0964973  6/2010

OTHER PUBLICATIONS

Claire M. Watts et al., "Terahertz compressive imaging with metamaterial spatial light modulators"; Nature photonics, vol. 8, Aug. 2014, pp. 605-609.
(Continued)

*Primary Examiner* — Nicole Ippolito
(74) *Attorney, Agent, or Firm* — Kile Park Reed & Houtteman PLLC (57) ABSTRACT

The present disclosure relates to a terahertz wave generation apparatus capable of wavefront control. A terahertz wave generating apparatus according to an exemplary embodiment comprises a photoconductive substrate; and a plurality of terahertz wave generating unit elements arranged in a two-dimensional array on the photoconductive substrate. Also, the terahertz wave generating unit elements comprise a plurality of first electrodes arranged in the two-dimensional array on the photoconductive substrate and respectively connected to a plurality of first electrode pads, and at least one second electrode formed on the photoconductive substrate so as to face the first electrodes.

18 Claims, 9 Drawing Sheets

(58) Field of Classification Search
USPC .......................................... 250/493.1, 504 R
See application file for complete search history.

(56) References Cited

U.S. PATENT DOCUMENTS

2012/0086096 A1    4/2012  Paek et al.
2014/0172374 A1    6/2014  Brady
2014/0346357 A1*  11/2014  Jarrahi .................... H01L 31/09
                                                     250/338.4

OTHER PUBLICATIONS

Ivo M. Vellekoop, "Feedback-based wavefront shaping", Optics Express, vol. 23, No. 9, May 4, 2015, pp. 12189-12206.
Kiwon Moon et al., "Bias field tailored plasmonic nano-electrode for high-power terahertz photonic devices"; Scientific Reports, Sep. 8, 2015, pp. 1-9.

* cited by examiner

APPARATUS FOR GENERATING TERAHERTZ WAVE AND METHOD FOR CONTROLLING TERAHERTZ WAVEFRONT USING THE SAME

CLAIM FOR PRIORITY

This application claims priority to Korean Patent Application No. 2016-0025830 filed on Mar. 3, 2016 in the Korean Intellectual Property Office (KIPO), the entire contents of which are hereby incorporated by reference.

BACKGROUND

1. Technical Field

The present disclosure relates to an apparatus for generating terahertz wave and a method for controlling terahertz wavefront using the same, and more particularly, to an apparatus for generating terahertz wave capable of controlling terahertz wavefront and a method for controlling terahertz wavefront using the same.

2. Related Art

Generally, the electromagnetic wave spectrum band ranged from 0.1 to 10 THz (1 THz is $10^{12}$ Hz) is defined as a terahertz wave band. In particular, a range from 0.1 to 3 THz is a region where gyrofrequencies and resonant frequencies of a wide variety of molecules are present. By acquiring these molecular fingerprints using non-destructive, unopened, and non-contact methods using terahertz waves, new core technologies may be provided in medical, agricultural food, environmental measurement, biotechnology, communications, non-destructive investigation, and advanced material evaluation. Accordingly, fierce competition is underway for the development of related core technologies.

For example, in the field of communications, transmission speed of data can be remarkably increased by using the terahertz waves. It is important to develop a technology capable of easily controlling the radiation angle and radiation direction of the terahertz waves for the breakthrough of such terahertz communications.

SUMMARY

Accordingly, exemplary embodiments of the present disclosure are provided to substantially obviate one or more problems due to limitations and disadvantages of the related art.

Exemplary embodiments of the present disclosure provide apparatuses for generating terahertz waves, capable of controlling wavefront of the terahertz waves, and methods for controlling the wavefront of the terahertz waves using the same.

In order to achieve the above-described objective, an aspect of the present disclosure provides a terahertz wave generating apparatus comprising a photoconductive substrate; and a plurality of terahertz wave generating unit elements arranged in a two-dimensional array on the photoconductive substrate, wherein the terahertz wave generating unit elements comprise a plurality of first electrodes arranged in the two-dimensional array on the photoconductive substrate and respectively connected to a plurality of first electrode pads, and at least one second electrode formed on the photoconductive substrate so as to face the first electrodes.

Here, the plurality of first electrodes may be arranged along at least two directions as divided into a plurality of groups spaced apart from each other.

Here, the first electrode pads corresponding to a number of the first electrodes may be provided in an outer peripheral portion of the photoconductive substrate.

Here, the second electrode may be embodied as an integral electrode branched at least in rows or columns so as to face each of the first electrodes.

Here, a positive bias voltage, a negative bias voltage, or a ground voltage may be selectively applied to each of the first electrodes.

Here, a ground voltage may be applied to the second electrode.

Here, at least one of the first electrodes and the second electrode may have at least one protrusion protruding in a direction toward a counter electrode.

Here, each of the first electrodes and the second electrode may have a plurality of protrusions protruding in a direction toward a counter electrode. Also, the protrusions may be arranged in parallel with at least one protrusion formed in the counter electrode in at least one region between the first electrodes and the second electrode.

Here, the apparatus may further comprise a split ring resonator formed between each of the first electrodes and the second electrode.

Here, the apparatus may further comprise a scattering type terahertz phase control plate disposed behind the photoconductive substrate.

Here, the apparatus may further comprise a pulse wave or continuous wave light source disposed in front of the photoconductive substrate.

Here, the apparatus may further comprise a spatial light modulator disposed in front of the photoconductive substrate.

In order to achieve the above-described objective, another aspect of the present disclosure provides a terahertz wavefront controlling apparatus comprising setting a target radiation direction of a terahertz wave, preparing a terahertz wave generating apparatus comprising a plurality of terahertz wave generating unit elements arranged in an array form and disposing a light source in front of the terahertz wave generating apparatus; and controlling individually ON/OFF of each of the terahertz wave generating unit elements so that a radiation direction of the terahertz wave radiated from the terahertz wave generating apparatus corresponds to the target radiation direction.

Here, in the controlling individually ON/OFF of each of the terahertz wave generating unit elements, the ON/OFF of each of the terahertz wave generating unit elements may be individually controlled by controlling a bias voltage applied to the each of the terahertz wave generating unit elements.

Here, in the controlling individually ON/OFF of each of the terahertz wave generating unit elements, a light emitted by a pulse wave light source or a continuous wave beating light source may be simultaneously incident on the entire terahertz wave generating unit elements.

Here, in the controlling individually ON/OFF of each of the terahertz wave generating unit elements, a spatial light modulator may be disposed in front of the terahertz wave generating unit elements, and a light may be incident on at least a part of the terahertz wave generating unit elements by using the spatial light modulator. Also, a same bias voltage may be applied to the entire terahertz wave generating unit elements.

As described above, the present disclosure provides a large-area array type terahertz wave generating apparatus capable of wavefront control and a terahertz wavefront control method using the same.

Using the apparatus and method according to the present disclosure, it is made possible to easily control the radiation angle and the radiation direction of the terahertz wave radiated from the terahertz wave generating apparatus. Accordingly, the application range of the terahertz wave can be extended.

BRIEF DESCRIPTION OF DRAWINGS

Example embodiments of the present invention will become more apparent by describing in detail example embodiments of the present invention with reference to the accompanying drawings, in which.

DESCRIPTION OF EXAMPLE EMBODIMENTS

Hereinafter, exemplary embodiments of the present disclosure and other matters necessary for those skilled in the art to understand the contents of the present disclosure will be described in detail. The exemplary embodiments to be described below and related arts have been specifically described in order to facilitate understanding of the present disclosure and are merely illustrative. That is, the present disclosure is not limited to the exemplary embodiments described below, but may be modified in various forms.

The terahertz wave technology can be used in various fields such as communications and imaging.

For example, the data transmission rate limit can be increased to from several Gbps to several hundred Gbps by increasing a carrier frequency using terahertz waves in the field of communications. In this way, when the carrier frequency is increased, the point-to-point communication concept is more efficient due to the characteristics of electromagnetic waves, and line-of-sight (LOS) communication in which the directions of the transmitting and receiving antennas face each other becomes essential. Therefore, the technology that can control the radiation angle in real time in the terahertz wave generating apparatus is very important technology for the development of terahertz communications.

In terahertz (THz) imaging for medical and industrial applications, the THz-wave makes it possible to see the difference between cancer and normal tissue. Further, the THz-wave has excellent ability to permeate non-metallic plastic or ceramic specimen, and is used in applications such as inspecting the interior of an object or diagnosing cancer early.

In connection with such the applications, it is very important to enhance the ability of the THz-wave to permeate various samples. Particularly, absorption of THz-waves is intensified in living tissue, and resolution degradation due to scattering may occur. In order to overcome this problem, a method of spatially controlling the wavefront of the THz-wave to increase its permeation depth and resolution should be provided.

Such wavefront control techniques have been specifically implemented with beam forming techniques in RF antenna technology.

However, at present, there is no phase adjustment technique such as in the RF region in the higher frequency region such as THz and the visible region.

Accordingly, the present disclosure proposes a two-dimensional array type large-area THz-wave generating apparatus having a spatial light modulator function. The large-area THz-wave generating apparatus of the present disclosure may include a THz-wave generating element such as a large-area THz photoconductive antenna (hereinafter, referred to as 'THz-PCA') or a large-area THz photomixer (hereinafter, referred to as 'THz-PM').

Also, the present disclosure proposes a THz-wave generating apparatus which can electrically control the radiation angle and radiation direction of the THz-wave by adjusting a phase distribution using a random phase delay plate together with the large-area THz-PCA and/or the large-area THz-PM.

That is, the present disclosure provides a THz-wave generating and THz-wavefront controlling apparatus of a new concept, which can control the radiation angle and radiation direction of a pulse type of THz or a continuous wave type of THz generated from a pulse type THz-PCA and/or a continuous wave type THz-PM by using electric means.

In particular, a THz-wave generating apparatus according to exemplary embodiments of the present disclosure may be implemented in an array type. For example, the THz-wave generating apparatus according to an exemplary embodiment may be configured as including a nano-electrode-integrated large-area array type THz-PCA (or THz-PM). The detail structure of the THz-wave generating apparatus of the present disclosure will be described later.

Hereinafter, exemplary embodiments of the present disclosure and other matters necessary for those skilled in the art to understand the contents of the present disclosure will be described in detail with reference to the accompanying drawings. However, the embodiments described below are merely illustrative, regardless of their representations. That is, the present disclosure is not limited to the exemplary embodiments described below, but may be implemented in various forms.

Figure 1:
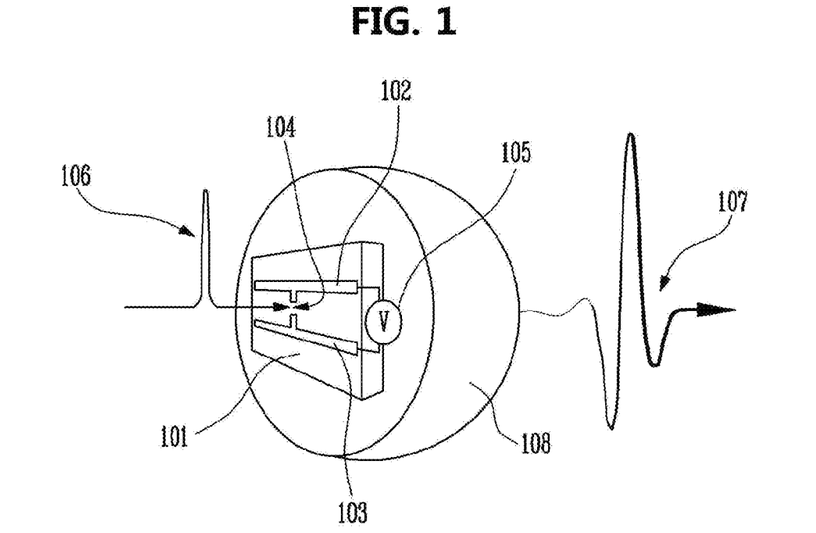
FIG. 1 is a diagram illustrating a structure and operation principle of a terahertz photoconductive antenna (THz-PCA) as an example of a terahertz wave generating element.

FIG. 1 is a diagram illustrating a structure and operation principle of a terahertz photoconductive antenna (THz-PCA) as an example of a terahertz wave generating element.

Referring to FIG. 1, a THz-PCA may generate a transient current having a very short duration (e.g., less than 1 picosecond), thereby generating a THz pulse 107.

More specifically, a positive electrode 102 and a negative electrode 103 are formed on a substrate 101 made of a semiconductor or other material having a photoconductive property for generating a transient current, and the positive electrode (anode) 102 and the negative electrode (cathode) 103 are formed so as to be spaced apart from each other (that is, a gap region 104 is formed between the positive electrode 102 and the negative electrode 103). A predetermined voltage 105 is applied between the anode 102 and the cathode 103 so that an electric field is formed in the gap region 104.

When a light pulse 106 having a very short duration is applied to the gap region 104, a transient current flows instantaneously between the anode 102 and the cathode 103 due to the photoconductive property of the substrate 101. This transient current emits the THz pulse 107 having an electric field magnitude proportional to the time derivative of the current in accordance with the electromagnetic law.

In order to improve the emission efficiency, the shapes of the anode 102 and the cathode 103 may be formed as having a planar antenna structure.

Also, a lens 108 having a hyper-hemispherical structure may also be used for improving the emission efficiency. The lens 108 may be disposed in the direction in which the THz pulse 107 is emitted for the directivity of the THz-wave.

A terahertz time-domain spectroscopy (hereinafter, referred to as 'THz-TDS') may be constructed using this THz-PCA.

For example, a THz-TDS that can be used for the THz spectroscopy may be configured by disposing a generating THz-PCA on a transmitting end and disposing a detecting THz-PCA on a receiving end.

Figure 2:
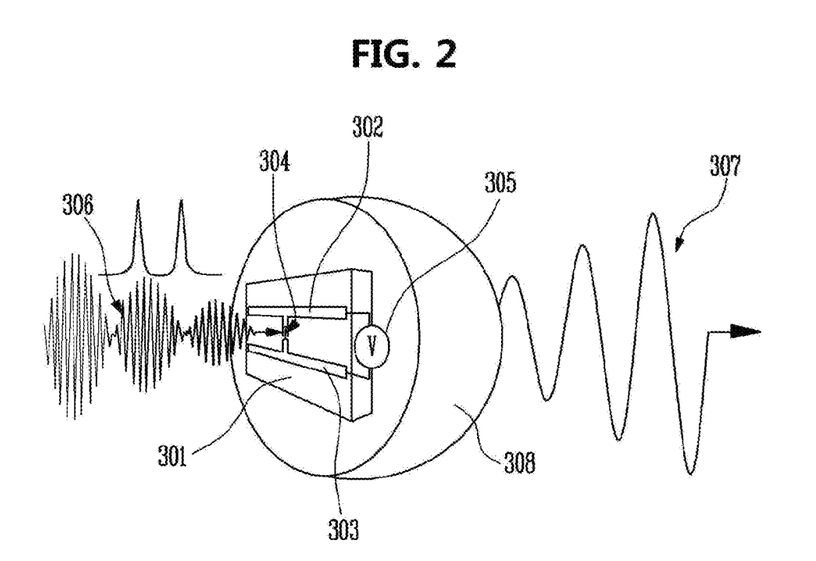
FIG. 2 is a diagram illustrating a structure and operation principle of a terahertz photomixer as another example of a terahertz wave generating element.

FIG. 2 is a diagram illustrating a structure and operation principle of a terahertz photomixer as another example of a terahertz wave generating element. More specifically, FIG. 2 shows the structure and operation principle of the THz-PM for generating the continuous wave THz signal.

Referring to FIG. 2, a THz generating PM may generate a transient current whose magnitude is modulated at a very high rate of the THz frequency, thereby generating a THz continuous wave 307.

More specifically, a positive electrode 302 and a negative electrode 303 are formed on a substrate 301 made of a semiconductor or other material having a photoconductive property for generating a transient current, and the positive electrode 302 and the negative electrode 303 (anode 302 and cathode 303 which are metal electrodes) are formed so as to have a gap region 304 including a finger structure or the like. A voltage 305 is applied between the anode 302 and the cathode 303 so that an electric field is formed in the gap region 304.

When a beating light source 306 vibrating at a THz frequency is incident on the gap region 304, a current oscillating continuously is generated between the anode 302 and the cathode 303 by the photoconductive property of the substrate 301, and this current emits a THz continuous wave 307 in accordance with the electromagnetic law.

In order to obtain the light source oscillating at the THz frequency, a method of generating the beating light source 306 that vibrates in time-domain by spatially overlapping two lasers having two different wavelengths may be used.

For example, a first semiconductor laser having a first wavelength (frequency ω1) and a second semiconductor laser having a second wavelength (frequency ω2) are combined through an optical system so as to generate the beating light source 306 vibrating at a frequency corresponding to a difference between the first frequency and the second frequency (i.e., ω1−ω2).

In order to improve the emission efficiency, the anode 302 and the cathode 303 may be formed in a planar antenna structure. Also, a lens 308 having a hyper-hemispherical structure may be used for improving the emission efficiency.

Such THz-PM may be used to construct a THz frequency-domain spectrometer (THz-FDS).

For example, a generating THz-PM and a detecting THz-PM are disposed on the transmitting end and the receiving end, respectively, so that THz-FDS may be configured to be used for THz spectroscopy and imaging similarly to the THz-TDS.

Particularly, in the spectroscopy, the frequency of the THz continuous wave 307 may be controlled by controlling the frequency of the beating light source 306 by adjusting the frequency of the first and/or second semiconductor laser.

The THz-wave generating element or the THz system using the THz-wave generating element as shown in FIGS. 1 and 2 may use the light pulse 106 or the beating light source 306 using a pulse laser or a semiconductor laser as a THz light source, and the characteristic of the light source is basically a point light source.

It is not easy to arbitrarily adjust the radiation angle and direction of the emitted THz beam even if an antenna, a lens, or the like is integrated to improve the light emission property. Although it is possible to control the radiation angle by using a mechanical method, the practical application is limited due to problems such as slow adjustment speed, high price, and precision of the mechanical system.

In order to overcome such the problem, the present disclosure proposes a THz-wave generating and wavefront controlling apparatus which can arbitrarily control the wavefront of THz-wave by using a THz-PCA or a THz-PM constructed in a form of an array each element of which an independent voltage can be applied to, and a THz scattering plate (THz-SP) composed of several kinds of random sized particles.

Accordingly, the present disclosure provides a novel concept of wavefront-controllable array type THz-wave generating apparatus capable of collectively controlling the propagation characteristics, permeation characteristics of specific media, radiation angle, and radiation direction of radiated THz-waves, and a method for controlling the same.

FIGS. 3A to 3D are diagrams illustrating a concept of wavefront control which is applied to exemplary embodiments of the present disclosure. Referring to FIGS. 3A to 3D, the concept of wavefront control and an exemplary embodiment using the wavefront control will be described.

Referring to FIGS. 3A to 3D, an array light source 501 may generate an electromagnetic wave phase of which can be adjusted.

Figure 3A:
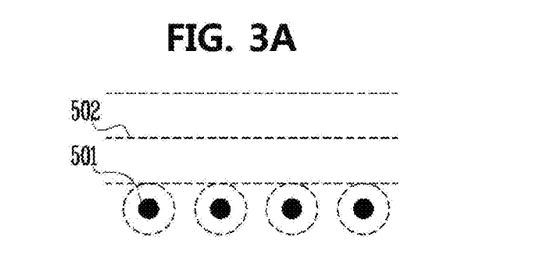
FIGS. 3A to 3D are diagrams illustrating a concept of wavefront control which is applied to exemplary embodiments of the present disclosure.

In FIG. 3A, a case in which electromagnetic waves are radiated by all the light sources 501 in the same phase is illustrated. In this case, the electromagnetic waves generated by the respective light sources 501 may form one wavefront 502, and generate electromagnetic waves propagating in a direction perpendicular to the surface on which the light sources 501 are arranged.

Figure 3B:
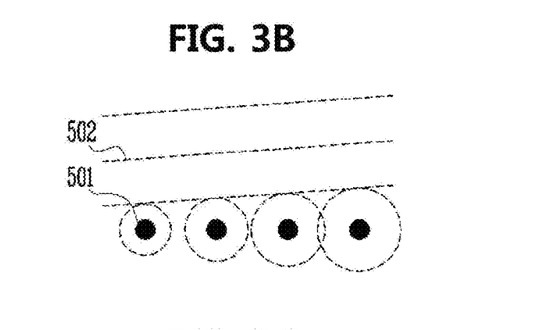

As illustrated in FIG. 3B, if the phase generated by the light source 501 varies linearly according to its position, the wavefront 502 generated by each of the light sources 501 is formed to have a constant angle on the surface on which the light sources 501 are arranged. As a result, the traveling direction of the electromagnetic wave is inclined. In this way, the traveling direction of the electromagnetic wave can be changed.

Figure 3C:
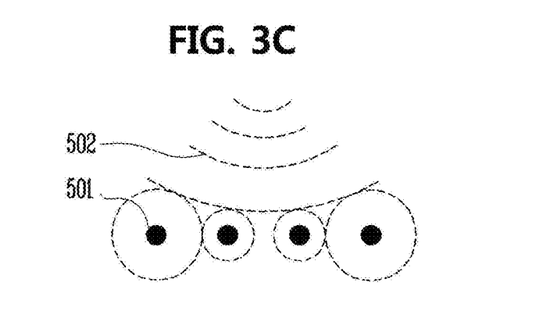

In FIG. 3C, illustrated is an example in which a spatial distribution of the phase is controlled nonlinearly, for example, in a form of a parabola so that the generated electromagnetic waves may be focused at a specific point without using an additional lens.

Figure 3D:
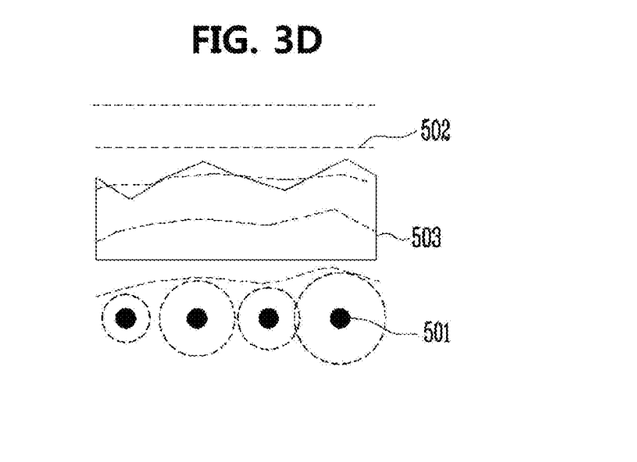

In FIG. 3D, illustrated is a process of restoring a plane wave by arbitrarily adjusting the phases to be plane by making the phases pass through a scattering structure (scattering body) 503.

The concept of phase control as shown in FIGS. 3A to 3D may be implemented by arranging THz-PCAs and/or THz-PMs in an array form. However, there is no technology that can continuously control the phase of each element constituting the array 360 degrees.

As an exemplary embodiment, the phase may be adjusted 180 degrees by reversing the direction of a bias applied to the element, and it may be possible to select not to operate a specific element by not applying a bias.

Alternatively, as an exemplary embodiment, it may be possible to change the distribution of light incident on each element by applying a mechanical method such as a spatial light modulator in a state where the same bias is applied to all of the elements constituting the array.

The wavefront control in such a limited situation will be described with reference to FIGS. 4A to 4C.

Figure 4A:
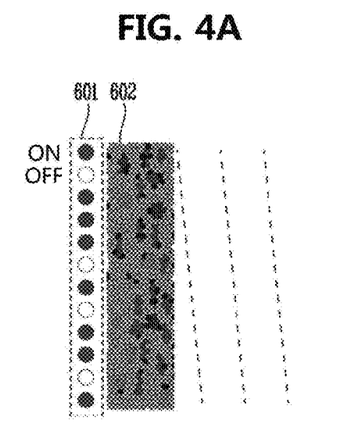
FIGS. 4A to 4C are diagrams illustrating a concept of a terahertz wavefront control apparatus according to an exemplary embodiment of the present disclosure.
Figure 4B:
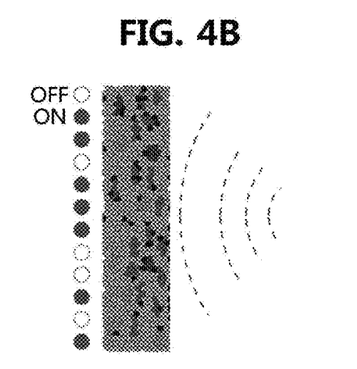
Figure 4C:
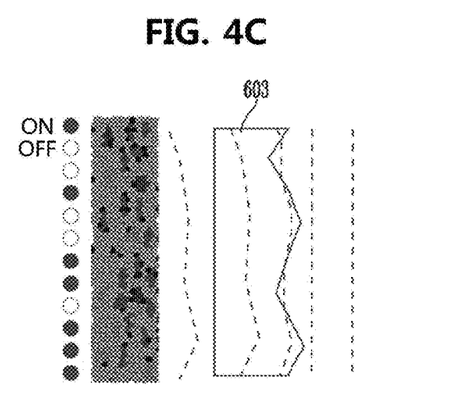

FIGS. 4A to 4C are diagrams illustrating a concept of a terahertz wavefront control apparatus according to an exemplary embodiment of the present disclosure. In particular, FIGS. 4A to 4C illustrate a concept of wavefront control by applying an embodiment using a THz generating element array 601 capable of individually switching, and a THz scattering plate (THz-SP) 602 prepared by randomly blending various kinds of particles.

In FIGS. 4A to 4C, the scattering plate 602 may be formed by randomly mixing various kinds of particles having different optical constants (refractive index) and size distribution. Due to these random characteristics, the THz-wave generated in each element constituting the array 601 may have a random distribution of the phase characteristics after passing through the scattering plate 602. If the elements exhibiting the phase characteristics matching the wavefront to be controlled can be found by an experimental method, and can be selectively biased or excited by light, the wavefront control described in FIGS. 3B to 3D may be achieved through only ON/OFF controls of the elements constituting the array 601.

As an exemplary embodiment, FIG. 4A illustrates an example of radiation direction control through wavefront control, and FIG. 4B illustrates an example of focusing a THz-wave through wavefront control. Also, FIG. 4C illustrates an example of permeation of the scatterer 603 through the wavefront control.

Figure 5:
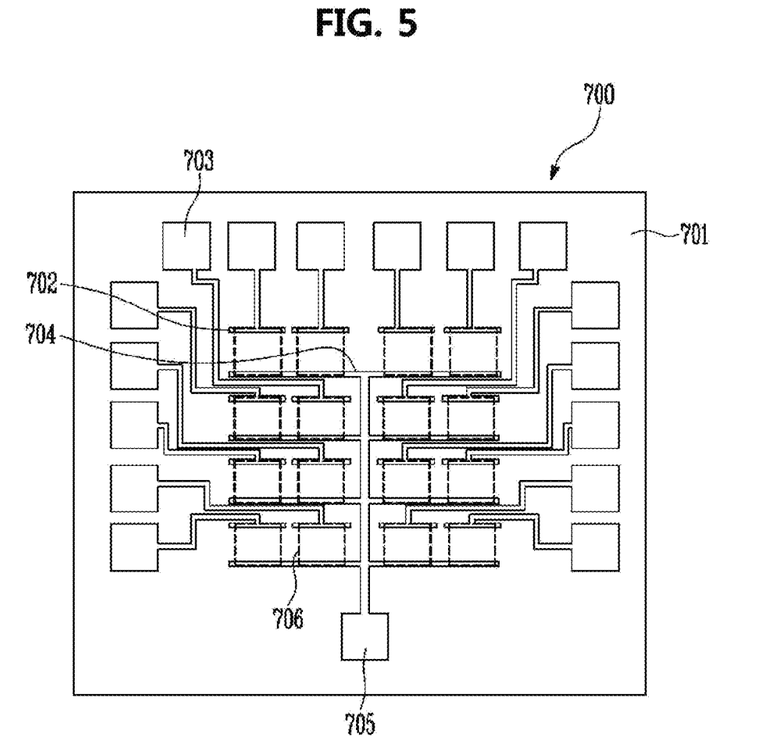
FIG. 5 is a view illustrating an array type THz-wave generating element included in a THz-wave generating apparatus according to an exemplary embodiment of the present disclosure.

FIG. 5 is a view illustrating an array type THz-wave generating element included in a THz-wave generating apparatus according to an exemplary embodiment of the present disclosure.

Referring to FIG. 5, an array type THz-wave generating element 700 according to an exemplary embodiment of the present disclosure may include an array type THz-PCA (or an array type THz-PM) in which a separate bias voltage can be applied to each THz-PCA (or THz-PM) unit constituting an array.

More specifically, in the present embodiment, first electrodes 702 and a second electrode 704 are arranged on a photoconductive substrate 701 as shown in FIG. 5, and thus the biases to be applied to the THz-wave generating unit elements 706 constituting the array, for example, the unit THz-PCAs (or the unit THz-PMs) can be individually controlled.

For this purpose, for example, the first electrodes 702 may be arranged in a two-dimensional array on the substrate 701 and individually connected to first electrode pads 703. For example, in the present embodiment, a plurality of first electrode pads 703 the number of which corresponds to the number of the first electrodes 702 may be provided, and the first electrode pads 703 may be formed on the photoconductive substrate 701. Accordingly, the voltage can be independently applied to each of the first electrodes 702.

Particularly, in the present embodiment, the first electrodes 702 are arranged in a two-dimensional matrix comprising at least 2×2 elements so that the wavefront control is facilitated. That is, the first electrodes 702 may be arranged to be spaced apart from each other in at least two different directions, for example, a first direction (e.g., the X direction) and a second direction (e.g., the Y direction).

In another embodiment, the first electrode 702 and the first electrode pad 703, which are electrically connected to each other, may be integrally formed. In this case, each pair of the first electrodes 702 and first electrode pads 703 connected thereto may be regarded as one component.

The first electrodes 702 may be a bias electrode or an anode, and a positive bias voltage, a negative bias voltage, or a ground voltage may be selectively applied to each of the first electrodes 702. Further, depending on the embodiment, the bias voltage applied to the first electrodes 702 may be further subdivided.

The second electrode 704 may be formed to face the first electrodes 702 on the substrate 701.

For example, in the present embodiment, one integrated second electrode 704 connected to one second electrode pad 705 may be provided. The second electrode 704 and the second electrode pad 705 electrically connected to the second electrode 704 may be integrally formed.

In the case that the single second electrode 704 is provided as described above, the second electrode 704 may be branched in rows and/or column so as to face each of the first electrodes 702 in each region for the unit elements 706. However, various embodiments of the present disclosure are not limited thereto. For example, according to an embodiment, a plurality of second electrodes 704 separated from each other may be provided.

The second electrode 704 may be a ground electrode or a cathode, and a ground voltage may be applied to the second electrode 704.

In each unit region defined by each of the first electrodes 702 and the second electrode 704 opposite thereto, each THz-wave generating unit element (e.g., unit THz-PCA) 706 may be formed. Each of the unit elements 706 may include its first electrode 702 and a portion of the second electrode 704 facing the first electrode 702, and each THz-wave generating unit element may be disposed between the first electrode 702 and the second electrode 704 or in a region defined by them.

In the present embodiment, since the first electrodes 702 are arranged in a two-dimensional array form, the THz-wave generating unit elements 706 are also arranged in a two-dimensional array form.

For example, the unit elements 706 may be arranged in the first and second directions (e.g., the X direction and the Y direction), respectively, and arranged in the form of a two-dimensional matrix array comprising at least 2×2 elements.

Meanwhile, in the present embodiment, the first electrodes 702 are arranged in a two-dimensional array so that the THz-wave generating unit elements 706 are arranged in a two-dimensional array on the photoconductive substrate 701. However, embodiments according the present disclosure are not limited thereto. For example, the THz-wave generating unit elements 706 may be arranged on the photoconductive substrate 701 in a two-dimensional array by dividing the second electrode 704 into a plurality of electrodes and arranging them in a two-dimensional array, or by arranging both of the first and second electrodes 702 and 704 in a two-dimensional array.

That is, according to the embodiment, a plurality of nano-electrode-type first and/or second electrodes 702 and 704 may be arranged in an array on the substrate 701 whereby a plurality of THz-waves generating unit elements 706 may be constructed.

According to the embodiment of the present disclosure, the nano-electrode-integrated large-area array type THz-wave generating element 700, for example, a nano-electrode-integrated large-area array type THz-PCA may be constructed.

In the embodiment of the present disclosure, for example, the direction of the transient current may be reversed by reversing the direction of the bias applied to the first electrodes 702. As a result, the phase of the emitted THz-wave may be changed by 180 degrees. Through this, the phase distribution of the THz-wave can be controlled by the digital array concept.

Meanwhile, functional structures having the purpose of increasing the efficiency of the elements or delaying the phase may be integrated in the THz-wave generating unit elements 706 shown in FIG. 5. A specific embodiment of this will be described with reference to FIGS. 6A to 6D.

FIGS. 6A to 6D are views illustrating various structures that can be integrated in a unit element of a THz-wave generating element according to an exemplary embodiment of the present disclosure.

First electrodes 801 of FIGS. 6A to 6D may correspond to the first electrodes 702 of FIG. 5, and a second electrode 802 of FIGS. 6A to 6D may correspond to the second electrode 704 of FIG. 5.

Figure 6A:
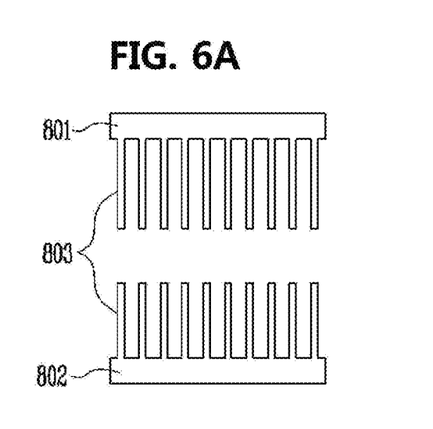
FIGS. 6A to 6D are views illustrating various structures that can be integrated in a unit element of a THz-wave generating element according to an exemplary embodiment of the present disclosure.
Figure 6B:
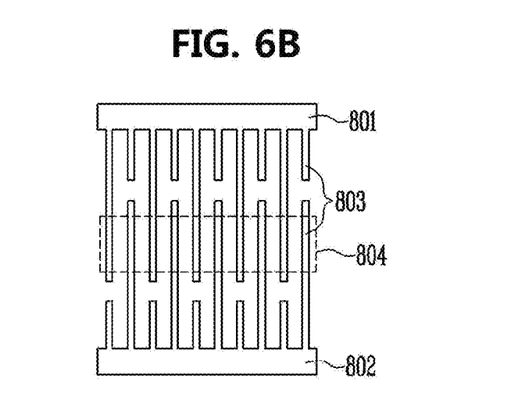

More specifically, FIGS. 6A and 6B illustrate examples of two electrode structures for increasing generation efficiency of THz-waves. According to the examples illustrated in FIGS. 6A and 6B, the first electrodes 801 and/or the second electrode 802 may include at least one protrusion 803 protruding in the direction toward the corresponding counter electrode.

For example, in the two electrode structures shown in FIGS. 6A and 6B, a plurality of protrusions (electrode array) 803 at nanometer level having sharp points in the first electrode 801 and the second electrode (ground line 802) may be formed.

Thereby, the bias electrode is locally strengthened through the sharp ends of the first and second electrodes 801 and 802 such that the generation efficiency of the THz-wave can be increased.

Also, FIG. 6B shows an exemplary structure in which the bias electrode is locally strengthened through side surfaces of the nano-electrode (i.e., the side surfaces of the protrusions 803 formed in the first and second electrodes 801 and 802) and a saturation phenomenon due to increase in light is mitigated.

For example, each of the protrusions 803 may be arranged in parallel with at least one protrusion 803 formed on the counter electrode in at least one region 804 between each first electrode 801 and the second electrode 802. In this case, protrusions 803 having a first length and a second length may alternately be formed in the first electrode 801 and the second electrode 802 facing each other.

Figure 6C:
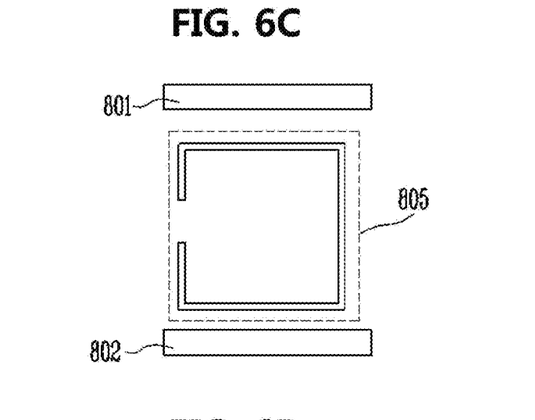
Figure 6D:
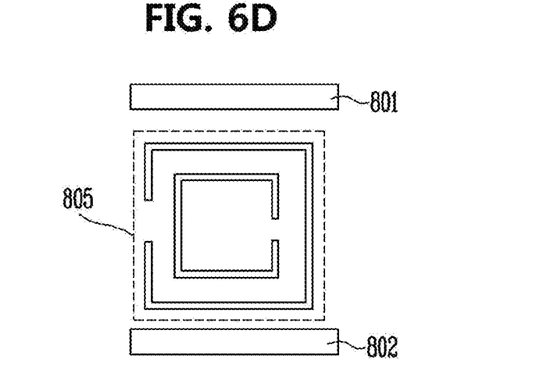

Also, FIGS. 6C and 6D illustrate an example of integration of a structure for causing the phase delay of the generated THz-wave. In the example, a split-ring resonator (hereinafter, 'SPR') structure 805 is integrated between the first electrode 801 and the second electrode 802.

For example, one or more rectangular open SPRs may be formed between each of the first electrodes 801 and the second electrode 802. The phase of the generated THz-wave can be delayed by integrating the SPR structure 805 as described above.

According to various embodiments, a technique of controlling the wavefront by spatially distributing various sizes and types of phase delay structures in one unit element (706 in FIG. 5) may be applied. With respect to such the phase delay structure, integration of a new type of phase delay structure, as well as a planar resonator or meta-material, may be possible.

Further, it may be also possible to combine at least one of the electrode structures shown in FIGS. 6A and 6B with at least one of the phase delay structures shown in FIGS. 6C and 6D.

Figure 7:
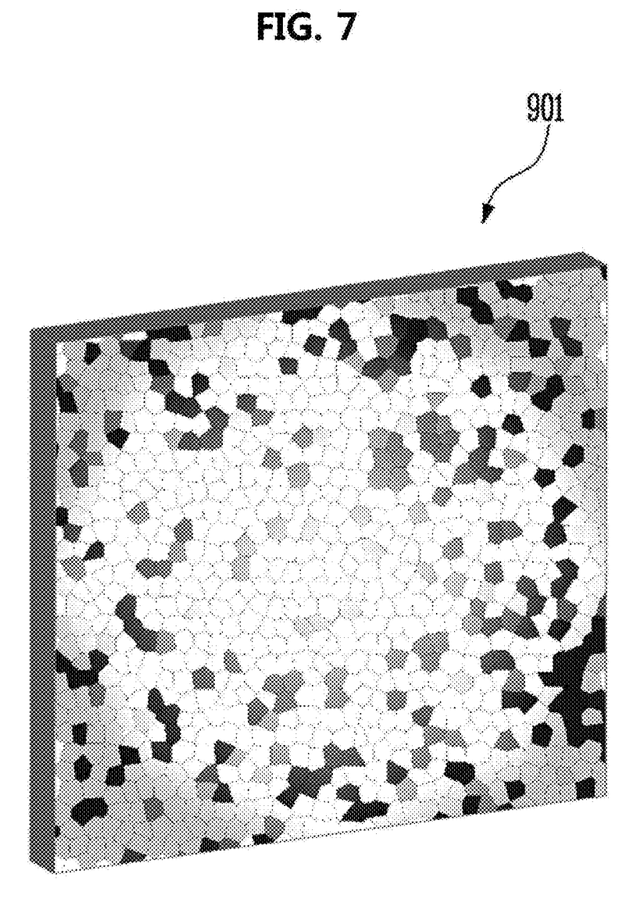
FIG. 7 is a view illustrating an exemplary embodiment of a scattering type THz phase delay plate fabricated by random particle mixing.

FIG. 7 is a view illustrating an exemplary embodiment of a scattering type THz phase delay plate fabricated by random particle mixing.

Referring to FIG. 7, a scattering type THz phase delay plate 901 may be manufactured by mixing particles of various sizes having various optical constants and processing into a single plate shape.

The materials that make up each particle may have optical constants of different sizes in the THz band, and may include metal particles, or artificial structures.

The material used for manufacturing the scattering type THz phase delay plate 901 may include a material having a small absorption of electromagnetic waves in the THz band, a material exciting a plasmon mode such as a metal, or a resonance structure such as meta-material.

The particles constituting the scattering type THz phase delay plate 901 may be contained in any adhesive substance or a high molecular substance such as high density polyethylene or Teflon.

Figure 8A:
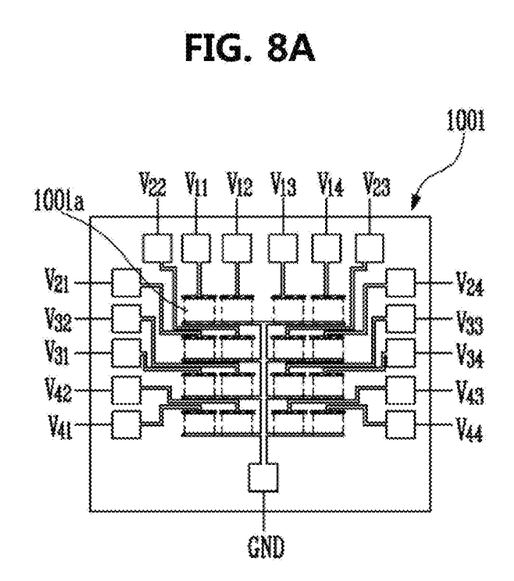
FIGS. 8A and 8B are views explaining a THz-wave generating apparatus and a THz-wavefront control method using the THz-wave generating apparatus according to an exemplary embodiment of the present disclosure.
Figure 8B:
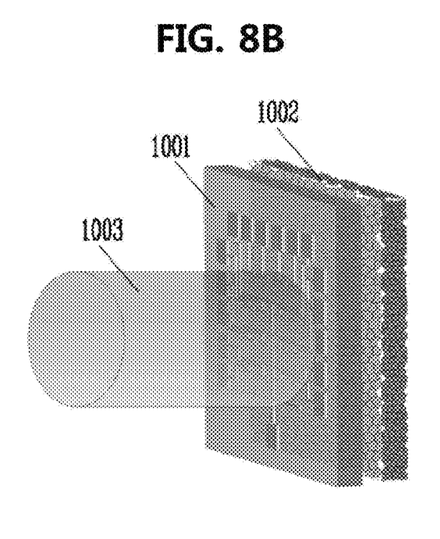

FIGS. 8A and 8B are views explaining a THz-wave generating apparatus and a THz-wavefront control method using the THz-wave generating apparatus according to an exemplary embodiment of the present disclosure. Particularly, FIGS. 8A and 8B show a large-area array type THz-wave generating element capable of addressing, a THz-wave generating and wavefront controlling apparatus using the THz-wave generating element, and a wavefront controlling method using the same. For convenience, it is assumed in FIGS. 8A and 8B that the THz-wave generating element is THz-PCA. However, it may be implemented with other types of THz-wave generating elements such as THz-PM.

Referring to FIGS. 8A and 8B, the wavefront of the THz-wave radiated through the bias arrangement of the array type THz-PCA 1001 may be controlled.

More specifically, as shown in FIG. 8A, a plurality of unit elements (THz-PCA units) 1001a are arranged in a two-dimensional matrix form in a large-area array type THz-PCA 1001. The THz-PCA 1001 shown in FIG. 8A may correspond to the array-type THz-wave generating element 700 described referring to FIG. 5.

For example, 16 unit elements 1001a may be arranged inside the THz-PCA 1001 in a form of a 4×4 matrix. The size and shape of the array (matrix) may be variously changed.

Each of the unit elements 1001a may be configured to be capable of independently receiving a bias voltage as in the embodiment described with reference to FIG. 5. For example, a voltage Vij which is independently selected among a positive bias voltage, a negative bias voltage, or a ground voltage may be applied to a unit element disposed in the i-th row and j-th column (i and j are natural numbers).

As shown in FIG. 8B, a scattering type THz phase control plate 1002 for randomizing a phase may be disposed behind the THz-PCA 1001.

Also, a pulse wave or a continuous wave light source for generating an optical pulse or a continuous wave may be disposed in front of the THz-PCA 1001, and light emitted from the pulsed wave or continuous wave light source may be irradiated to all of the unit elements 1001.

For example, the continuous wave beating light source 1003 may be disposed in front of the THz-PCA 1001 so that light can be simultaneously irradiated to all of the plurality of THz-wave generating unit elements 1001a arranged in an array form, and the light can be incident on all of the unit elements 1001a.

Thereafter, for the wavefront control, the bias voltage applied to each of the unit elements 1001a may be individually adjusted, so that the voltage arrangement suitable for a specific purpose may be derived in an experimental manner.

For example, ON/OFF of each of the unit elements 1001a may be individually controlled by selectively applying a bias voltage divided into three stages of a positive bias voltage, a ground voltage and a negative bias voltage to the first electrode of each of the unit elements 1001a.

Meanwhile, the bias voltage applied to each of the unit elements 1001a may be divided into three levels of +V, 0, and −V, or may be further subdivided.

In the above-described manner, the radiation wavefront of the THz-wave may be controlled by controlling ON/OFF of each of the unit elements 1001a so as to obtain a radiation angle and/or a radiation direction corresponding to a specific purpose. Accordingly, the desired voltage arrangement may be derived in an experimental manner.

For example, the THz-wavefront control method according to the present embodiment may include a step of setting a target radiation angle and/or a target radiation direction of a THz-wave, a step of preparing a THz-wave generating apparatus (e.g., a THz-wave generating apparatus including an array type THz-PCA 1001) including a plurality of THz-wave generating unit elements 1001a arranged in a form of array and arranging a light source (e.g., a continuous wave beating light source 1003) in front of the THz-wave generating apparatus, and a step of controlling the radiation angle and/or the radiation direction of the THz-wave emitted from the THz-wave generating apparatus to be matched to the target radiation angle and/or the target radiation direction by individually controlling ON/OFF of each of the THz-wave generating unit elements 1001a.

Particularly, in the present embodiment, ON/OFF of each of the unit elements 1001a may be individually controlled by individually controlling the bias voltage applied to each of the unit elements 1001a.

Meanwhile, in the controlling ON/OFF of each of the THz-wave generating unit elements 1001a, light emitted from the pulse wave source or continuous wave beating light source 1003 may be simultaneously incident on all of the unit elements 1001a.

According to the above-described embodiment of FIGS. 8A and 8B, it is possible to easily adjust the radiation wavefront of the THz-wave by an electrical method that individually controls the bias voltage applied to each of the THz-wave generating unit elements 1001a.

Meanwhile, although an exemplary embodiment in which the scattering type THz phase control plate 1002 is used for phase control was described with reference to FIGS. 8A and 8B, various embodiments of the present disclosure are not limited thereto. For example, depending on the embodiment, a scattering plate, that is, a scattering type THz phase control plate 1002 may be omitted or another type of phase control structure capable of replacing it may be applied. For example, another type of phase control structure using meta-material or controlling the phase through thickness control of a material may be applied.

That is, the scattering type THz phase control plate 1002 applied to the present embodiment is not simply interpreted as being limited to the scattering plate, but should be comprehensively interpreted as being a phase control/delay structure of a higher concept.

Figure 9:
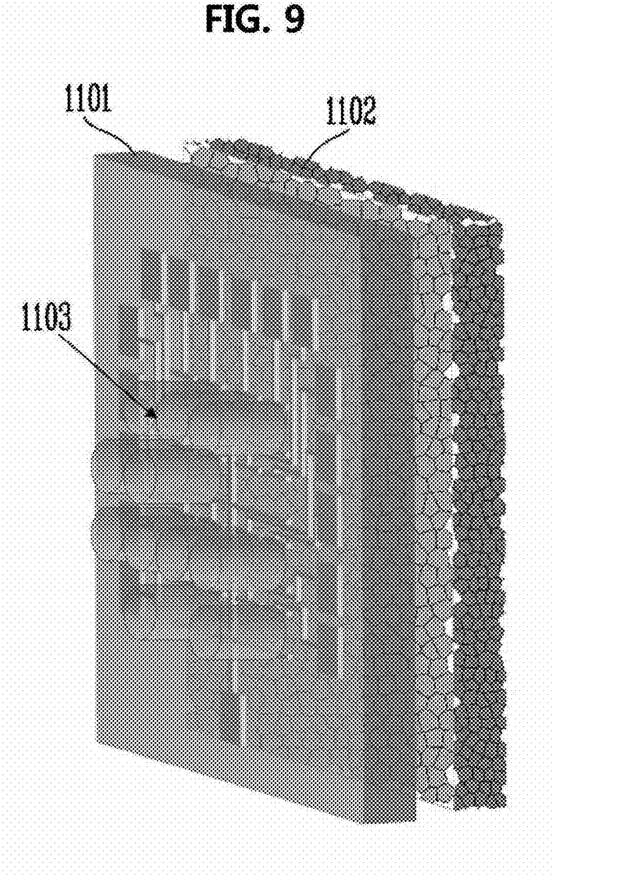
FIG. 9 is view illustrating a THz-wave generating apparatus and a THz-wavefront control method using the THz-wave generating apparatus according to another exemplary embodiment of the present disclosure.

FIG. 9 is view illustrating a THz-wave generating apparatus and a THz-wavefront control method using the THz-wave generating apparatus according to another exemplary embodiment of the present disclosure. Particularly, FIG. 9 shows a THz-wave generating and wavefront controlling apparatus using a large-area array type THz-wave generating element and a spatial light modulator, and a THz-wavefront control method using the same. On the other hand, the spatial light modulator is schematically shown in a form of light emitted from the spatial light modulator.

Referring to FIG. 9, in the present embodiment, a spatial light modulator 1103 may be arranged in front of an array type THz-wave generating element, for example, a THz-PCA 1101, ON/OFF of each of the unit elements constituting the THz-PCA 1101 may be controlled by using the spatial light modulator 1103 in an optical manner. According to the embodiment, the array type THz-PCA 1101 shown in FIG. 9 may correspond to the array type THz-wave generating elements 700 and 1001 shown in FIGS. 5 and 8A.

Also, in the present embodiment, a scattering type THz phase control plate 1102 for randomizing a phase may be disposed behind the THz-PCA 1101.

In the present embodiment, the radiation wavefront of the THz-wave may be controlled by applying the same bias voltage to all of the unit elements constituting the array type THz-PCA 1101, and optically controlling ON/OFF of each unit element using the spatial light modulator 1103. For example, the same bias voltage may be applied to the first electrode of each of the unit elements, and a light may be selectively irradiated to at least only a part of the unit elements, such that a radiation angle corresponding to a specific purpose can be obtained.

For example, the THz-wavefront control method according to the present embodiment may include a step of setting a target radiation angle and/or a target radiation direction of a THz-wave, a step of preparing a THz-wave generating apparatus including an array type THz-PCA 1101 and arranging a light source (e.g., a spatial light modulator 1103) in front of the THz-wave generating apparatus, and a step of individually controlling ON/OFF of each of the THz-wave generating unit elements 1001a such that the radiation angle and/or the radiation direction of the THz-wave emitted from the THz-wave generating apparatus are adjusted to the target radiation angle and/or the target radiation direction.

Particularly, in the present embodiment, the spatial light modulator 1103 may be disposed in front of the unit elements constituting the array-type THz-PCA 1101, and a light may be selectively incident on at least a part of the unit elements by using the spatial light modulator 1103 such that ON/OFF of each of the unit elements can be individually controlled.

Meanwhile, in the step of individually controlling ON/OFF of each of the unit elements, the same bias voltage may be applied to all of the unit elements.

That is, in the present embodiment, an optical switching method in which the spatial light modulator 1103 is disposed in front of the THz-wave generating unit elements constituting the array type THz-PCA 1101 and light is selectively incident on the unit elements may be used for individually controlling ON/OFF of the unit elements.

Accordingly, in the present embodiment, the radiation wavefront of the THz-wave can be controlled so as to obtain a radiation angle and/or a radiation direction corresponding to a specific purpose. Thus, the desired voltage arrangement may be derived in an experimental manner.

Figure 10A:
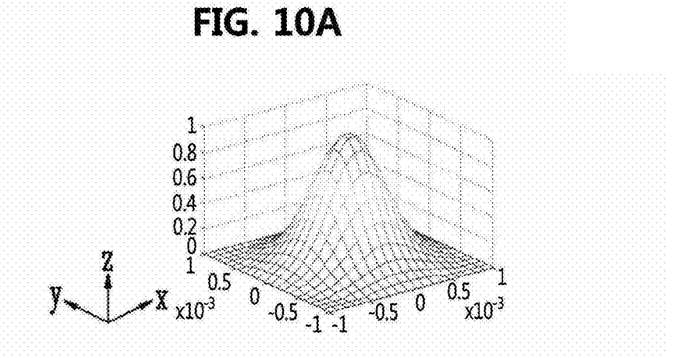
FIGS. 10A and 10B are diagrams illustrating a THz-wave distribution in a remote field according to a THz-wave distribution in a Gaussian form on a light emitting surface.
Figure 10B:
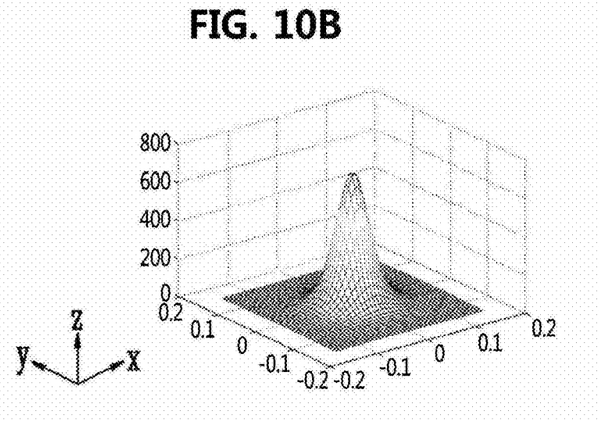
Figure 11A:
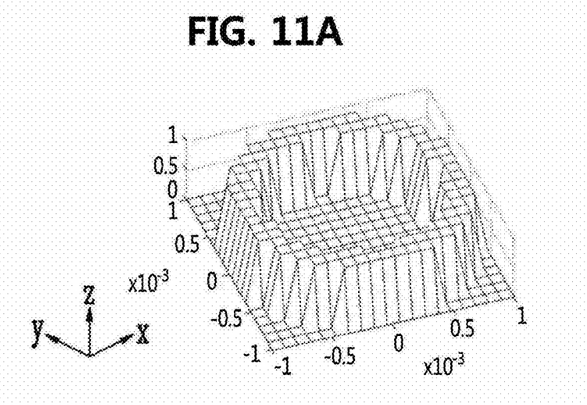
FIGS. 11A and 11B are diagrams illustrating a THz-wave distribution in a remote field according to a circular ring-shaped THz-wave distribution on a light emitting surface.
Figure 11B:
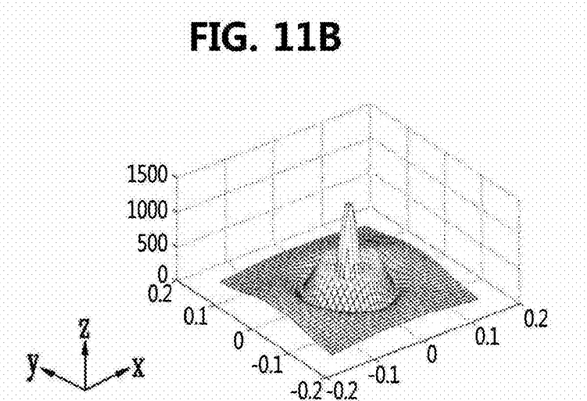

FIGS. 10A and 10B are diagrams illustrating a THz-wave distribution in a remote field according to a THz-wave distribution in a Gaussian form on a light emitting surface. Also, FIGS. 11A and 11B are diagrams illustrating a THz-wave distribution in a remote field according to a circular ring-shaped THz-wave distribution on a light emitting surface.

Hereinafter, an exemplary embodiment of an experimental method for controlling a radiation angle will be described with reference to FIGS. 10 to 11.

First, a THz-wave generating apparatus according to an exemplary embodiment of the present disclosure is prepared, and a THz-wave detecting element may be disposed in a far-field region spaced apart from the THz-wave generating apparatus by a predetermined distance (for example, not less than 10 times the wavelength). The position of the THz-wave detecting element may be changed.

When a light emitting surface of a THz-wave generating apparatus including an array type THz-wave generating elements 700, 1001, and 1102 according to an embodiment of the present disclosure is placed on an x-y plane, an axis perpendicular to the light emitting surface may be defined as a z-axis.

The position of the THz-wave detecting element which is spaced a predetermined distance from the THz-wave generating apparatus can be expressed by a (X, Y, Z) coordinate.

A bias voltage matrix (e.g., V11, V12, V13, . . . , V1m; V21, V22, . . . , V2m, . . . , Vnm; m and n are natural numbers) having the highest magnitude of the THz-wave signal detected for one coordinate (X1, Y1, Z1) may be experimentally found.

The above-described operation may be performed for a combination of a plurality of coordinates, and matrices obtained for respective coordinates may be stored in advance. In actual use, spatial scanning of THz-waves may be possible through the use of this combination.

As another example, it may be possible to measure a beam intensity distribution by placing a CCD camera capable of measuring a two-dimensional distribution of the THz-wave in the remote field region or the near-field region. A bias voltage matrix optimizing the measured distribution may be found experimentally. For example, it may be possible to find a distribution with strong signal strength at (X1, Y1).

As another example, a THz-wave intensity distribution in the remote field may be adjusted by adjusting a light emission distribution of each of the unit elements 706 and 1001a without scattering plates (e.g., scattering-type THz phase control plates 901 and 1002).

As illustrated in FIG. 10, when the THz-wave is generated by the Gaussian light without adjusting the bias voltage matrix, the THz-wave distribution in the remote field also follows the Gaussian form.

More specifically, FIG. 10A illustrates a Gaussian THz-wave distribution on the light emitting surface measured when all of the unit elements 706 and 1001a of the THz-wave generating apparatus are turned on. In FIG. 10A, x and y values are values indicating positions of the unit elements 706 and 1001a for generating THz-waves in units of $10^{-3}$ meters (i.e., millimeters), and a z value is a value indicating the intensity of the electric field. For example, the z value may be a value proportional to volts/meter.

In FIG. 10B, the distribution of THz-waves in the remote field due to the generation of Gaussian THz-waves is illustrated. In FIG. 10B, x and y values are values indicating the positions of the unit elements 706 and 1001a for generating THz-waves in units of meters, and a z value is a value indicating the intensity of the electric field. For example, the z value may be a value proportional to volts/meter.

Meanwhile, the THz-wave distribution on the light emitting surface of the THz-wave generating apparatus may be adjusted by individually adjusting the bias voltage applied to each THz-wave generating unit element 1001a as described in the exemplary embodiment of FIGS. 8A and 8B, or by using the spatial light modulator 1103 as described in the exemplary embodiment of FIG. 9.

For example, as illustrated in FIG. 11A, the THz-wave distribution on the light-emitting surface may be converted into a circular ring shape by using an electric switching method for adjusting the bias voltage or an optical switching method using the spatial light modulator 1103.

As illustrated in FIGS. 11A and 11B, it may be possible to control the THz-wave distribution in the remote field to a Bessel beam form instead of the Gaussian beam form as shown in FIG. 11B by controlling the THz-wave distribution in the light emitting surface as shown in FIG. 11A. As shown in FIG. 11B, the Bessel beam has a narrower THz-wave distribution width than the Gaussian beam. Also, while the width of the THz-wave distribution increases and diverges as the Gaussian beam propagates the width of the Bezel beam is maintained constant. Therefore, high-resolution imaging is possible in applications such as imaging, and light alignment is easy.

The exemplary embodiment illustrated in FIGS. 11A and 11B show an example of adjusting the THz-wave distribution on the light emitting surface. Using the THz-wave generating apparatus according to the embodiment of the present disclosure, the THz-wave distribution on the light emitting surface may be easily adjusted to an arbitrary shape.

Therefore, according to the embodiment of the present disclosure, it is possible to variously adjust the radiation characteristic of the THz-wave generating apparatus to match the desired radiation angle, radiation direction, and the like.

According to the above-described embodiments of the present disclosure, a THz-wave generating element (i.e., THz-PCA or THz-PM 700, 1001, and 1101) with a large-area array type having a spatial light modulation function by integrating a nanostructure and a phase delay plates 901, 1002, and 1102 producing a spatially random phase delay may be used to electrically and optically measure the radiation angle and radiation direction of the THz-waves.

That is, the present disclosure provides a large-area array type THz-wave generating apparatus capable of wavefront control and a THz-wavefront control method using the THz-wave generating apparatus.

According to the above-described embodiments of the present disclosure, techniques such as beam forming and beam steering, which have not been provided in the THz frequency band, can be realized. Accordingly, the embodiments of the present disclosure can be usefully utilized in various fields such as mobile communications and military uses.

Further, according to the above-described embodiments of the present disclosure, it is possible to realize a technique of allowing a THz-wave to transmit through a complex scatterer, or to generate a self-focused THz-wave. Accordingly, the application range of the THz-wave can be expanded.

Although the technical idea of the present disclosure has been specifically described in accordance with the above-described exemplary embodiments, it should be noted that the above exemplary embodiments are intended to be illustrative and not restrictive. It will be apparent to those skilled in the art that various modifications may be made without departing from the scope of the technical idea of the present disclosure.

What is claimed is:

1. A terahertz wave generating apparatus comprising:
   a photoconductive substrate; and
   a plurality of terahertz wave generating unit elements arranged in a two-dimensional array on the photoconductive substrate,
   wherein the terahertz wave generating unit elements comprise a plurality of first electrodes arranged in the two-dimensional array on the photoconductive substrate and respectively connected to a plurality of first electrode pads, and at least one second electrode formed on the photoconductive substrate so as to face the first electrodes, and
   wherein each of the terahertz wave generating unit elements is individually ON/OFF controlled so that a radiation direction of the terahertz wave radiated from the terahertz wave generating apparatus corresponds to a target radiation direction.

2. The terahertz wave generating apparatus according to claim 1, wherein the plurality of first electrodes are arranged along at least two directions as divided into a plurality of groups spaced apart from each other.

3. The terahertz wave generating apparatus according to claim 1, wherein the first electrode pads corresponding to a number of the first electrodes are provided in an outer peripheral portion of the photoconductive substrate.

4. The terahertz wave generating apparatus according to claim 1, wherein the second electrode is embodied as an integral electrode branched at least in rows or columns so as to face each of the first electrodes.

5. The terahertz wave generating apparatus according to claim 1, wherein a positive bias voltage, a negative bias voltage, or a ground voltage is selectively applied to each of the first electrodes.

6. The terahertz wave generating apparatus according to claim 1, wherein a ground voltage is applied to the second electrode.

7. The terahertz wave generating apparatus according to claim 1, wherein at least one of the first electrodes and the second electrode has at least one protrusion protruding in a direction toward a counter electrode.

8. The terahertz wave generating apparatus according to claim 1, wherein each of the first electrodes and the second electrode has a plurality of protrusions protruding in a direction toward a counter electrode.

9. The terahertz wave generating apparatus according to claim 8, wherein the protrusions are arranged in parallel with at least one protrusion formed in the counter electrode in at least one region between the first electrodes and the second electrode.

10. The terahertz wave generating apparatus according to claim 1, further comprising a split ring resonator formed between each of the first electrodes and the second electrode.

11. The terahertz wave generating apparatus according to claim 1, further comprising a scattering type terahertz phase control plate disposed behind the photoconductive substrate.

12. The terahertz wave generating apparatus according to claim 1, further comprising a pulse wave or continuous wave light source disposed in front of the photoconductive substrate.

13. The terahertz wave generating apparatus according to claim 1, further comprising a spatial light modulator disposed in front of the photoconductive substrate.

14. A terahertz wavefront controlling method comprising:
    setting a target radiation direction of a terahertz wave,
    preparing a terahertz wave generating apparatus comprising a plurality of terahertz wave generating unit elements arranged in an array form and disposing a light source in front of the terahertz wave generating apparatus; and
    controlling individually ON/OFF of each of the terahertz wave generating unit elements so that a radiation direction of the terahertz wave radiated from the terahertz wave generating apparatus corresponds to the target radiation direction.

15. The terahertz wavefront controlling method according to claim 14, wherein, in the controlling individually ON/OFF of each of the terahertz wave generating unit elements, the ON/OFF of each of the terahertz wave generating unit elements is individually controlled by controlling a bias voltage applied to the each of the terahertz wave generating unit elements.

16. The terahertz wavefront controlling method according to claim 15, wherein, in the controlling individually ON/OFF of each of the terahertz wave generating unit elements, a light emitted by a pulse wave light source or a continuous wave beating light source is simultaneously incident on all of the terahertz wave generating unit elements.

17. The terahertz wavefront controlling method according to claim 14, wherein, in the controlling individually ON/OFF of each of the terahertz wave generating unit elements, a spatial light modulator is disposed in front of the terahertz wave generating unit elements, and a light is incident on at least a part of the terahertz wave generating unit elements by using the spatial light modulator.

18. The terahertz wavefront controlling method according to claim 17, wherein, in the controlling individually ON/OFF of each of the terahertz wave generating unit elements, a same bias voltage is applied to all of the terahertz wave generating unit elements.

* * * * *